US007072021B2

(12) United States Patent
Lallemant et al.

(10) Patent No.: US 7,072,021 B2
(45) Date of Patent: Jul. 4, 2006

(54) LITHOGRAPHIC APPARATUS AND DEVICE MANUFACTURING METHOD

(75) Inventors: Nicolas Alban Lallemant, Veldhoven (NL); Martinus Cornelis Maria Verhagen, Valkenswaard (NL); Marcel Beckers, Eindhoven (NL); Ronald Stultiens, Veghel (NL); Pascal Antonius Smits, Genderen (NL); Wladimir Franciscus Gerardus Maria Hertog, Velden (NL); David Theodorus Willy Van Der Plas, Eindhoven (NL); Stephan Koelink, Eindhoven (NL); Henk Krus, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/876,760

(22) Filed: Jun. 28, 2004

(65) Prior Publication Data

US 2005/0254025 A1     Nov. 17, 2005

Related U.S. Application Data

(60) Provisional application No. 60/571,534, filed on May 17, 2004.

(51) Int. Cl.
   *G03B 27/52*     (2006.01)
   *G03B 27/42*     (2006.01)

(52) U.S. Cl. .......................................... 355/30; 355/53
(58) Field of Classification Search .................. 355/30, 355/53, 72, 75
   See application file for complete search history.

(56) References Cited

U.S. PATENT DOCUMENTS

| 6,665,046 | B1 * | 12/2003 | Nogawa et al. ................ 355/30 |
| 6,721,031 | B1 * | 4/2004 | Hasegawa et al. ............. 355/30 |
| 6,721,032 | B1 * | 4/2004 | Hasegawa et al. ............. 355/30 |
| 6,867,844 | B1 * | 3/2005 | Vogel et al. ................... 355/30 |
| 6,970,228 | B1 * | 11/2005 | Aoki et al. .................... 355/30 |
| 2002/0018190 | A1 | 2/2002 | Nogawa et al. |
| 2002/0191163 | A1 | 12/2002 | Hasegawa et al. |
| 2004/0156026 | A1 | 8/2004 | Kamiya |

FOREIGN PATENT DOCUMENTS

| EP | 1 229 573 A1 | 8/2002 |
| WO | WO 02/054460 A1 | 7/2002 |

OTHER PUBLICATIONS

European Search Report issued for European Patent Application No. 05076148.5, dated Aug. 12, 2005.

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus is disclosed. The apparatus includes an illuminator for conditioning a beam of radiation, and a first support for supporting a patterning device that serves to pattern the beam of radiation according to a desired pattern. The apparatus also includes a second support for supporting a substrate, a projection system for projecting the patterned beam onto a target portion of the substrate, and at least one gas generator for generating a conditioned gas flow. The gas generator includes a guiding element for guiding the gas flow to a lower volume generally located below a lower surface of the projection system and to a volume between the lower surface and the substrate. The guiding element directs the gas flow in a generally downward direction and then in a direction generally parallel to the lower surface.

11 Claims, 6 Drawing Sheets

US 7,072,021 B2

LITHOGRAPHIC APPARATUS AND DEVICE MANUFACTURING METHOD

CROSS-REFERENCE TO RELATED APPLICATIONS

This application claims the benefit of priority from U.S. Provisional Patent Application No. 60/571,534, entitled "LITHOGRAPHIC APPARATUS AND DEVICE MANUFACTURING METHOD," filed May 17, 2004, the content of which is incorporated herein by reference in its entirety.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

In the ongoing efforts for attaining higher resolutions at smaller imaging dimensions in lithographic systems, projection systems are used that have numerical apertures that are well above 0.8. These systems tend to be very bulky and wide in dimensions, in particular near the lower surface of the system where the radiation (light) exits the projection system for illuminating a substrate. Furthermore, these high numerical apertures have a working distance that is usually very small (only a few millimeters), which causes the projection system to be placed very close to the wafer surface. As a result of this, in practical setups, there is very little room provided for arrangements that are operative in the area between the lower surface of the projection system and the substrate. One of these arrangements that are operative in the above indicated area is an gas shower system that is present to condition the "gas" (which is usually a very fine conditioned composition of gases) in this area. This conditioning, among others, is necessary for defining a stable gas environment so that interferometric measurement beams are unhindered by refractive index fluctuations. This is necessary for obtaining reliable (sub) nanometer measurements of the position of the substrate in relation to the projection system, so that a pattern is reliably imaged at a predefined position of the substrate.

However, the above indicated developments of bulkier projection systems and closer working distances thus make it difficult to position the gas shower system in such a way that this area as a whole is sufficiently reached. In particular, due to the lower working distance and bulkier projection system, there is virtually not enough room to place an gas shower system in such a way that the gas flow is sufficiently able to condition the volume located below a lower plane of the machine setup above the wafer table. Generally, such a lower plane may be formed by the lowest plane of the projection system, which could be the exit plane of the lower lens. Otherwise this plane could be formed by the Z-mirror that is used in determining the z-height of the substrate to be illuminated.

SUMMARY

It is an aspect of the present invention to provide a lithographic system where the area below the projection system is better reached by the gas shower system. To this end, the invention provides a lithographic system that includes a radiation system for providing a beam of radiation; a first support structure for supporting a patterning device, the patterning device serving to pattern the beam of radiation according to a desired pattern; a second support structure for supporting a substrate; a projection system for projecting the patterned beam onto a target portion of the substrate, the projection system including a lower surface for defining a working distance to the substrate; and at least one gas generating structure for generating a conditioned gas flow in a volume extending between the lower surface and the substrate, the gas generating structure including a guiding element for guiding the gas flow to a lower volume generally located below the lower surface of the projection system, wherein the guiding element directs the gas flow from a generally downward direction to a direction generally parallel to the lower surface of the projection system.

According an embodiment, a guiding element guides the gas to a direction along the lower surface of the projection system in a volume below the projection system, thus optimizing the gas flow below the lower surface of the projection system, while the gas shower system can be positioned at least partly generally above a lower surface of the projection system.

The guiding element may include a guiding surface oriented generally perpendicular to a direction of incidence of the gas flow. Further, preferably, the guiding element directs the gas flow from a generally downward direction from the upper to the lower volume, to a direction generally parallel to the lower surface of the projection system. In this way, the volume directly under the projection system can be reached by the gas flow, that flows from the side downwards alongside the projection system.

In an embodiment, the upper volume is sectioned by a casing that encloses the projection system, wherein the guiding element is a cut out section in the casing enclosing the projection system, for guiding the gas flow along the cut out section towards the lower volume. Thus, in this way, by these cut out sections, a passage to the gas flow is provided generally through the lower part of the projection system. In particular, the cut out section may include a generally downward oriented slope extending to a generally flat lower surface of the projection system. It is noted that a further benefit is derived from these cut-out sections since it distances the outer surface of the projection system from the gas flow. In this way, the gas is less affected by the surface temperature of the projection system, which may slightly differ from the conditioned temperature of the gas flow.

In an embodiment, the guiding element may be a deflecting panel that is positioned to deflect the gas stream towards the lower volume. Here, the deflecting panel may be shaped to provide a first downward flow direction, and a second flow direction, that is generally parallel to a lower surface of the projection system to deflect the gas flow according to the Coanda effect. This effect was discovered in 1930 by Henri-Marie Coanda who observed that a stream of gas (or a other fluid) emerging from a nozzle tends to follow a nearby curved surface, in particular if the curvature of the surface or angle the surface makes with the stream slant.

In an embodiment, the panel may be adjacent to a Z-mirror, defining the lower surface of the projection system. Further, the panel may include a suction opening included with a suction device to pull the gas flow towards a generally horizontal flow. Such a suction may support the Coanda effect to "pull" the gas flow close to the curve of the panel. Additionally, preferably, the panel may include a recess is for guiding an interferometric beam in the recess.

In an embodiment, the structure for generating the conditioned gas flow (also shortly indicated as "gas shower") may include a second guiding element that is arranged in the gas flow to locally deflect the gas flow, in order to arrive a split gas flow that is partially directed to the upper volume and partially to the lower volume. The gas flow velocities in the split gas flows may differ. In particular, a part of the gas flow that is directed to the volume of the projection system may have a higher velocity than the part of the gas flow that is directed to the lower volume. In such a configuration, the high speed gas flow penetrates more easily to the volume directly below the lower surface of the projection system. Hence, the velocity distribution induces a change in pressure distribution that is operative to provide a guiding effect, by convection, so that the direction of the more downward velocity gas flow is also oriented more parallel to the lower surface of the projection system.

The second guiding element may be formed by a plurality of slats arranged in the gas flow.

To be employed in a setup near the projection system, the panel may include a first radial shape oriented generally radially when viewed from a center of the projection system, and a second tangential shape oriented generally partly around the projection system, and wherein the gas generating structure is arranged to provide a gas flow directed generally perpendicular to the panel structure.

The guiding element may be physically attached to a metro frame carrying the projection system. The gas generating structure may be attached to a base frame, mechanically decoupled from the metro frame.

In an embodiment, a lithographic apparatus is provided. The apparatus includes an illuminator for conditioning a beam of radiation and a first support for supporting a patterning device. The patterning device serves to pattern the beam of radiation according to a desired pattern. The apparatus also includes a second support for supporting a substrate, and a projection system for projecting the patterned beam onto a target portion of the substrate. The projection system includes a lower surface for defining a working distance to the substrate. The apparatus also includes at least one gas generator for generating a conditioned gas flow. The gas generator includes a guiding element for guiding the gas flow to a lower volume generally located below the lower surface of the projection system and to a volume between the lower surface and the substrate. The guiding element directs the gas flow in a generally downward direction and then in a direction generally parallel to the lower surface of the projection system.

In an embodiment, a lithographic apparatus is provided. The apparatus includes an illuminator for conditioning a beam of radiation, and a first support for supporting a patterning device. The patterning device serves to pattern the projection beam according to a desired pattern. The apparatus also includes a second support for supporting a substrate, and a projection system for projecting the patterned beam onto a target portion of the substrate. The projection system includes a lower surface for defining a working distance to the substrate. The apparatus also includes at least one gas generator for generating a conditioned gas flow in a volume extending between the lower surface and the substrate. The gas generator is arranged to generate a gas flow that is directed towards a volume of the projection system above the lower surface. The gas generator includes a guiding element for guiding the gas flow to a lower volume generally located below the lower surface of the projection system.

In an embodiment, a device manufacturing method is provided. The method includes patterning a beam of radiation, projecting the patterned beam of radiation onto a target portion of a substrate with a projection system, generating a conditioned gas flow in a volume extending between a lower surface of the projection system and the substrate, and guiding the gas flow in a generally downward direction and then to a direction generally parallel to the lower surface of the projection system.

In an embodiment, a device manufacturing method is provided. The method includes patterning a beam of radiation, projecting the patterned beam of radiation onto a target portion of a substrate with a projection system, generating a conditioned gas flow in a volume extending between a lower surface of the projection system and the substrate, directing the gas flow towards a volume of the projection system above the lower surface, and guiding the gas flow to a lower volume generally located below the lower surface of the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system". In particular, the projection system may include a plurality of partly stacked optical elements which may be transmissive (lenses), or reflective (mirrors). Generally, the projection system is configured in such a way the radiation exits from the projection system through a lowest optical element, defining a lower surface of the projection system. More in particular, the lower surface of the projection system is defined by the lowest surface that is present above the scan region of the substrate. In a number of configurations, this lowest surface may be formed by a Z-mirror that is used for controlling the Z-position of the support structure that supports the substrate.

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
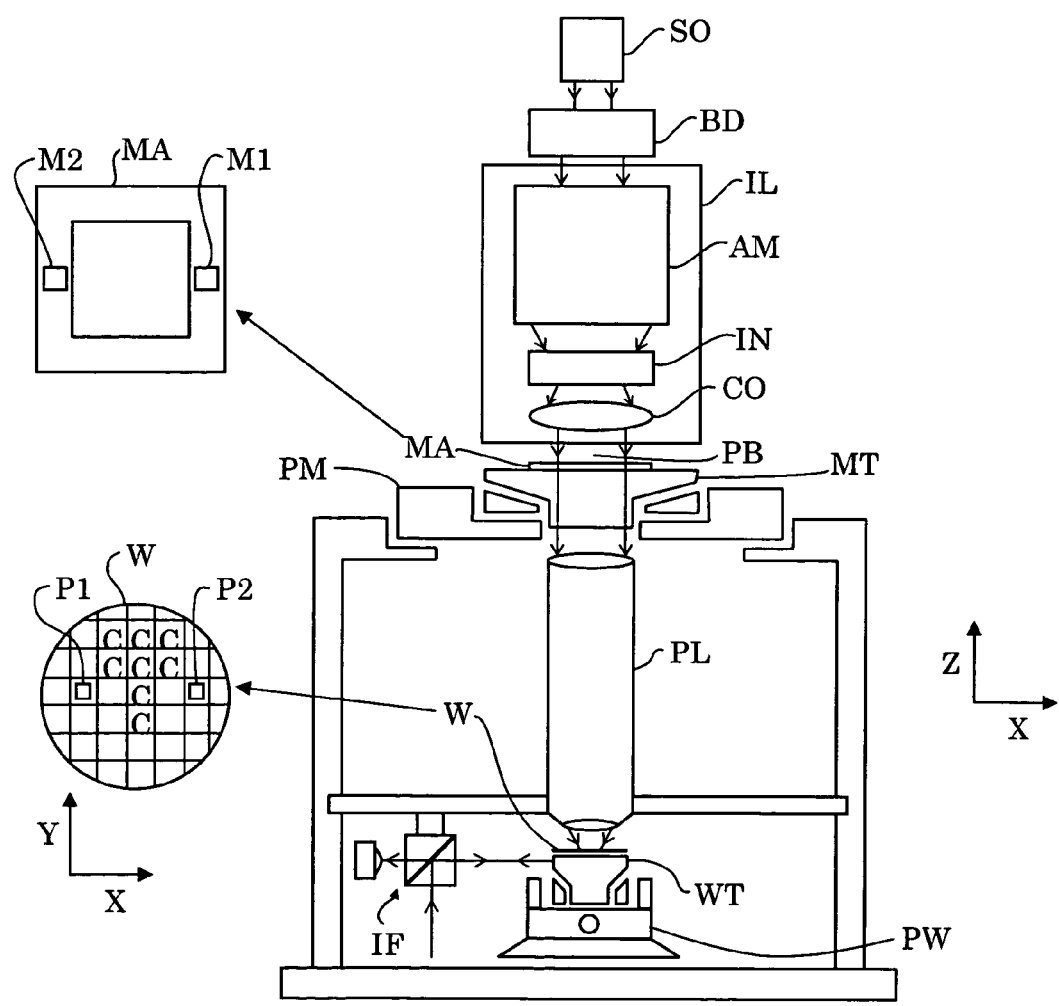
FIG. 1 is a schematic view of a lithographic apparatus according to an embodiment of the invention.

FIG. 1 schematically depicts a lithographic apparatus according to an embodiment of the invention. The apparatus includes: an illumination system (illuminator) IL for providing a projection beam PB of radiation (e.g. UV radiation or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a refractive projection lens) PL for imaging a pattern imparted to the projection beam PB by the patterning device MA onto a target portion C (e.g. comprising one or more dies) of the substrate W. The term substrate table as used herein can also be considered or termed as a substrate support. It should be understood that the term substrate support or substrate table broadly refers to a structure that supports, holds, or carries a substrate.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example, when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively)

of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
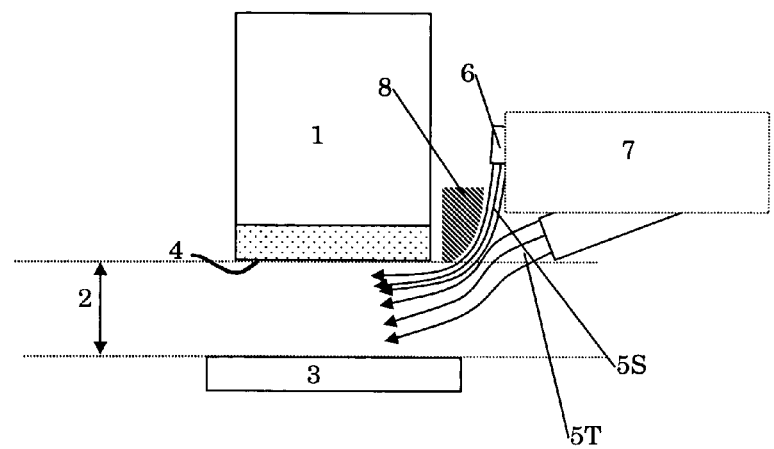
FIG. 2 is a schematic view of an embodiment of a guiding element a gas shower of the apparatus of FIG. 1.

An embodiment of the invention is illustrated in FIG. 2. In FIG. 2, a projection system 1 that is located at a working distance 2 above a substrate 3 is depicted. The projection system 1 typically includes a plurality of partly stacked optical elements (not shown) which may be transmissive (lenses), or reflective (mirrors). Generally, the projection system 1 is configured in such a way that the radiation exits from the projection system through a lowest optical element that defines a lower surface 4 of the projection system 1. In particular, the lower surface 4 of the projection system 1 is defined by the lowest surface that is present above the scan region of the substrate 3. In a number of configurations, this lowest surface may be formed by a Z-mirror, as will be further illustrated with reference to FIG. 3, that is used for controlling the Z-position of the substrate 3. In this embodiment, the invention uses the Coanda effect for guiding a gas flow 5S emerging from a nozzle 6 of a gas generating structure 7, shortly called a gas shower or a gas generator, along a curved surface of a guiding element 8. In this way, the guiding element 8 guides the gas flow 5S to a lower volume generally located below the lower surface 4 of the projection system 1 from a generally downward direction to a direction generally parallel to the lower surface 4 of the projection system 1. Although FIG. 2 shows the gas stream to be directed initially alongside the guiding element 8, as will be shown with reference to FIG. 7, alternatively, the gas stream 5S may be directed generally under an angle to the guiding surface and generally horizontal with respect to the lower surface 4, or slightly at an angle, to be deflected downwards by the guiding element 8 in a generally downward direction.

Figure 3:
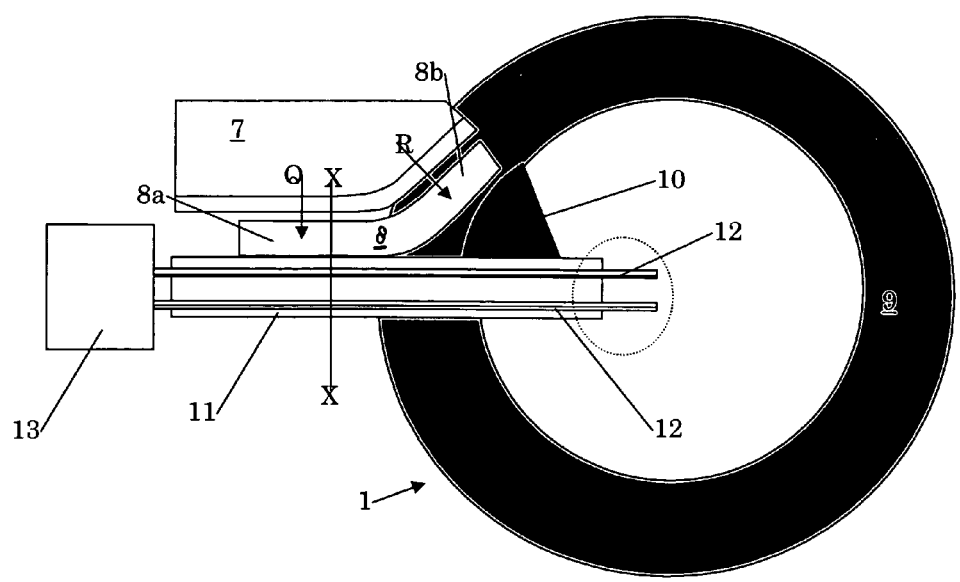
FIG. 3 is a plan view of a portion of the apparatus, including a projection system, of FIG. 1 when viewed from below.

FIG. 3 depicts a plan view of the arrangement below the projection system 1 depicted when viewed from below. The projection system 1 is shown as a generally round hull 9 that encloses a plurality of stacked optical elements (not shown), and wherein a cut out section 10 is provided in the hull enclosing the projection system, for guiding the gas flow along the cut out section and to the volume generally central below the projection system 1. These cut-out sections 10 will be further described with reference to FIG. 9. FIG. 3 also shows the guiding element 8 for guiding the gas to a direction along the lower surface of the projection system 1. The guiding element 8 may be in the form of a deflecting panel that is positioned to deflect the gas stream towards the lower volume. The function of this panel has been illustrated with reference to FIG. 3. A Z-mirror 11 is oriented generally along a middle line of the arrangement. The function of the Z-mirror 11 is for forming a reference frame for determining the Z-position (height) of substrate 3. In the depicted embodiment, parallel to the Z-mirror 11 and below it (so in the view of FIG. 3 illustrated in front of the Z-mirror), interferometric reference beams 12 are radiated from an interferometric measuring unit 13 for determining X- and/or Y-positions of the stage that supports the substrate (not shown). Generally speaking, the volume that needs to be conditioned is formed along and enclosing the path of the interferometric beams 12, for reasons of controlling the refractive index of the gas. Thus, it can be seen that the volume central to the projection system (indicated by dotted lines), due to its low position relative to the substrate, may be difficult to condition, since it is located farthest from the gas shower 7. To be able obtain the central parts below the projection system 1, the gas shower 7 has a generally two part main direction of gas output: one first direction Q substantially perpendicular to the Z-mirror 11 and a second direction R oriented from the perimeter of the projection system 1 in a generally radial direction toward the centre of the projection system 1. To guide the gas flow towards these directions, a first part 8a of the guiding element 8 is aligned in along the Z-mirror 11 generally radially when viewed from the center of the projection system 1, and a second part 8b is oriented generally partly around the projection system 1 in a tangential form. Additionally, the gas shower 7 is arranged to provide a gas flow (Q, R) directed generally under an angle α to the guiding element 8.

Figure 4:
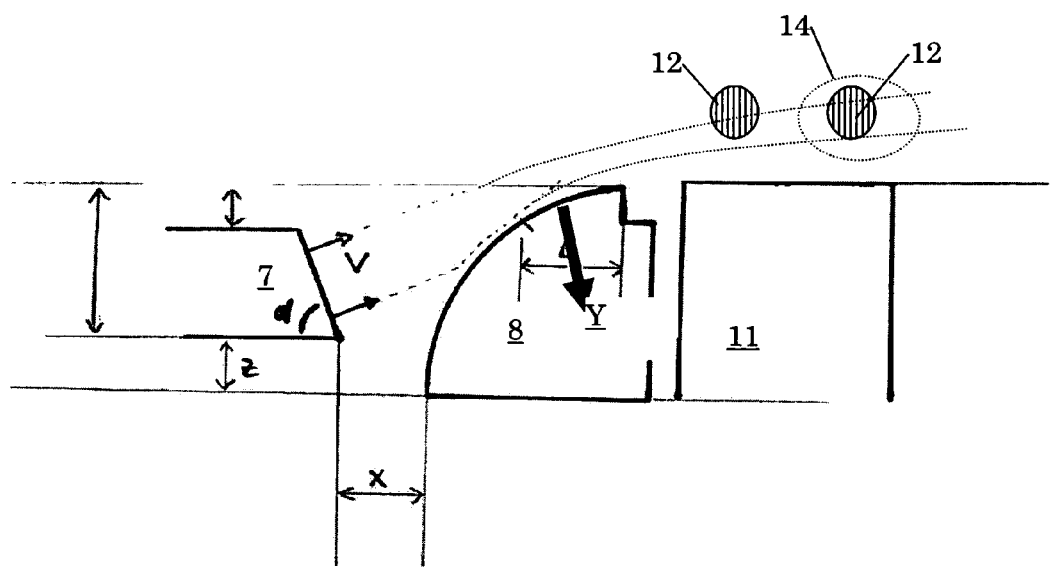
FIG. 4 is a cross-sectional view taken along line X—X in FIG. 3.

FIG. 4 is a cross-sectional view of FIG. 3 along the line X—X. As is shown in FIG. 4, the guiding element 8 is adjacent to the Z-mirror 11 that defines the lower surface of the projection system 1. Using the guiding element 8, the gas flow stays in contact with the guiding surface of the guiding element 8 and is able to reach the region 14 below the Z-mirror 11, in particular the region positioned opposite to the guiding element 8 where the temperature and density are to be kept stable for the interferometric beams. An arrow Y is depicted to identify a suction opening that is included with a suction device to pull the gas flow towards a generally horizontal flow. Such a suction may have an additional guiding effect supporting the Coanda effect.

Figure 5:
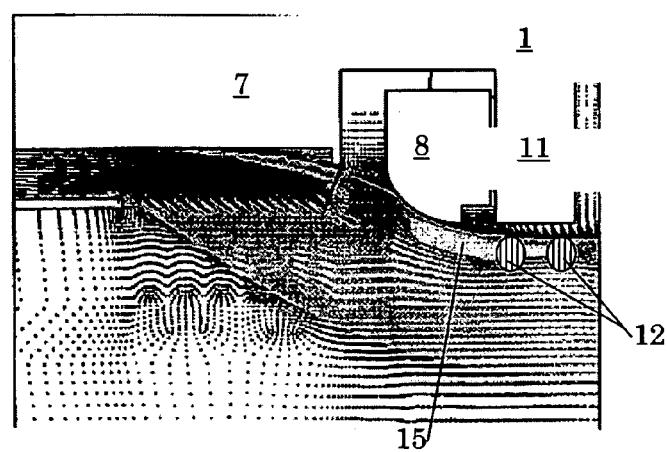
FIG. 5 shows a simulation of an embodiment according to the arrangement shown in FIG. 4.

A simulation with the angle α=68° is shown in cross-sectional view in FIG. 5. A lighter part 15 of the gas flow indicates a higher velocity. In this arrangement, the gas flow curves well around the guiding element 8 and reaches the relevant area 14 without disturbances.

Figure 6:
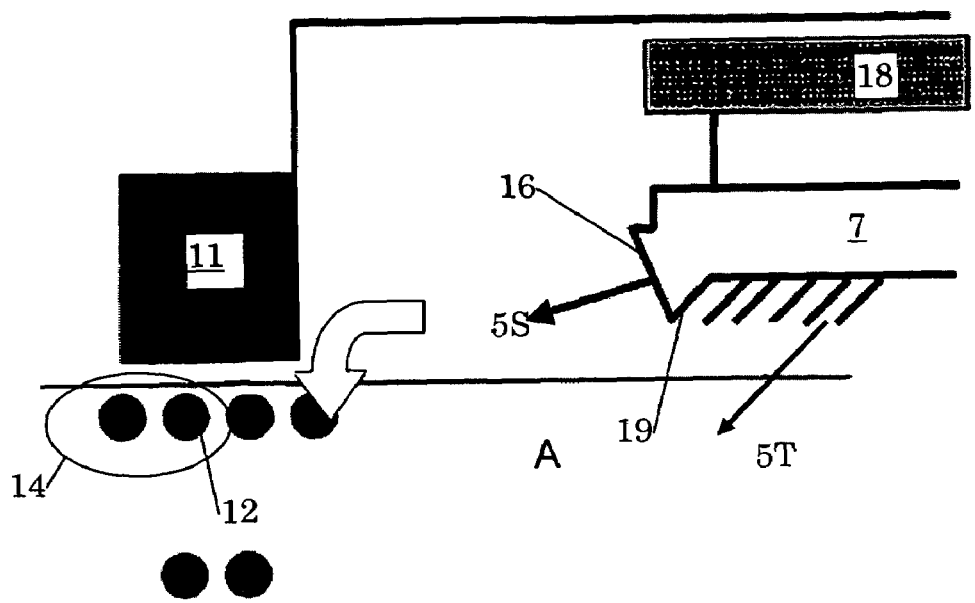
FIG. 6 is a schematic illustration of gas flow in a portion of the apparatus of FIG. 1 when the guiding element is absent.
Figure 7:
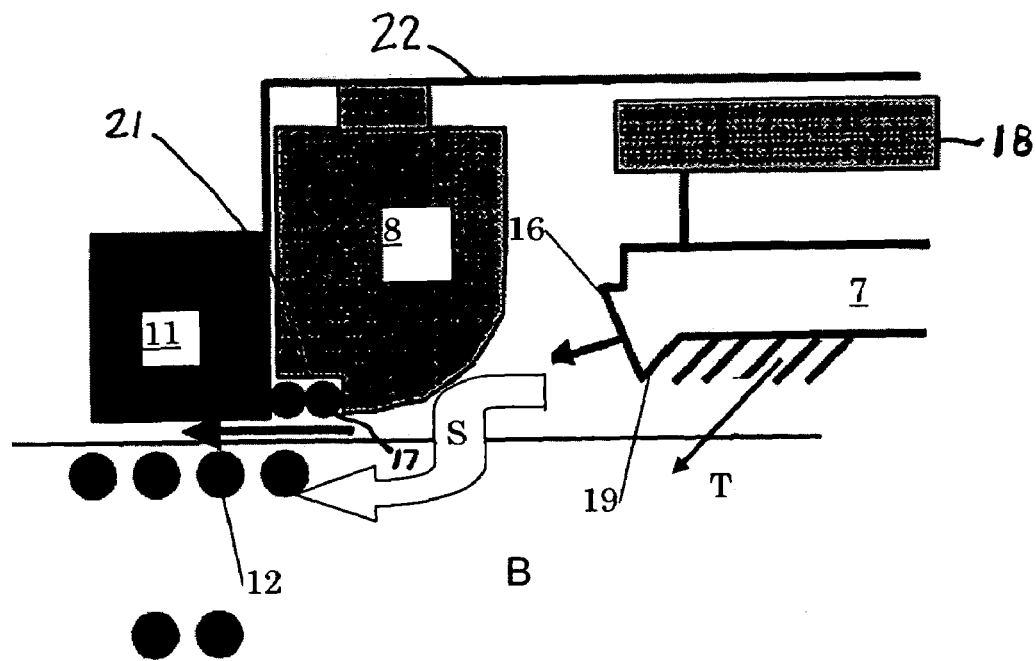
FIG. 7 is a schematic illustration of gas flow in the portion of the apparatus shown in FIG. 6 when the guiding element is present.

FIG. 6 and FIG. 7 are illustrated in combination to visualize the effect of the guiding element 8 in absent (FIG. 6) or present (FIG. 7) state. As can be seen in FIG. 6, the outlet 16 of gas shower 7 is directed towards a volume of the projection system above the lower surface of Z-mirror 11. In absent state of the deflector, the gas flow 5S bounces against the side wall of the Z-mirror 11 and would cause disturbances and unconditioned gas, in particular in region 14. However, as can be seen in FIG. 7, due to the guiding element 8, the gas flow 5S is guided towards region 14 by following the contour of the guiding element 8 due to the Coanda effect.

FIG. 7, also shows a recess 21 directly adjacent to the Z-mirror 11 for guiding an interferometric beam 17. The Z-mirror 11, guiding element 8, and projection system 1 are mounted on a metro frame 22 that is dynamically separated from a base frame 18, which is grounded to the earth and carries the gas shower 7.

Figure 8:
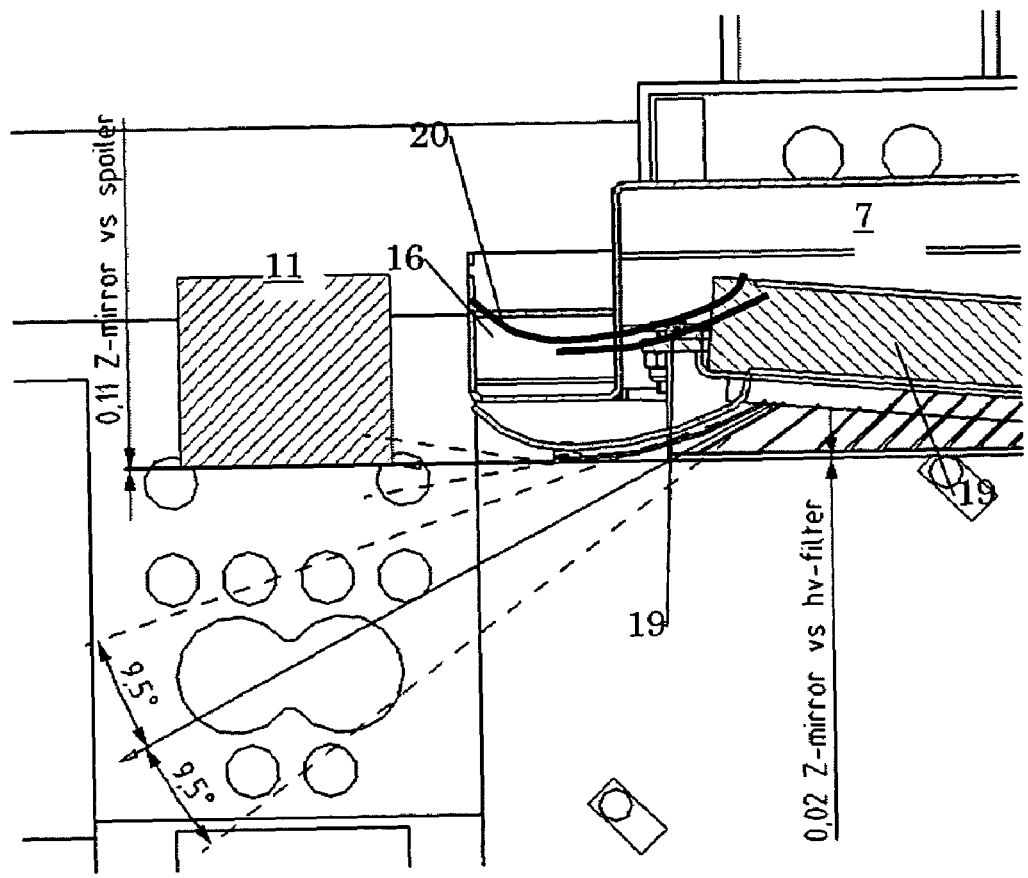
FIG. 8 shows an embodiment of a gas shower of the apparatus of FIG. 1.

FIGS. 6–8 also show that the gas shower 7 includes a second structure 19, 20 for deflecting partially the gas flow 5T to a lower volume below the lower surface of Z-mirror 11. This second gas flow 5T may have a gas flow velocity that is lower than the velocity of the 5S gas flow. The flow is split by a slat 19, or vane, that defines the upper outlet 16. This slat 19 is formed to provide an accelerating effect to the gas flow, in combination with upper guiding surface 20. To provide a consistent gas flow S, a plurality of slats, or vanes, may be formed in the gas flow for providing an more optimum guiding effect to the gas flow. In this arrangement, the 5S gas flow is directed to be deflected downwards by the guiding element 8 in a generally downward direction. It is noted that FIG. 8 is illustrated without the guiding element 8 but with the slat 19 for providing an accelerated gas stream S.

Figure 9:
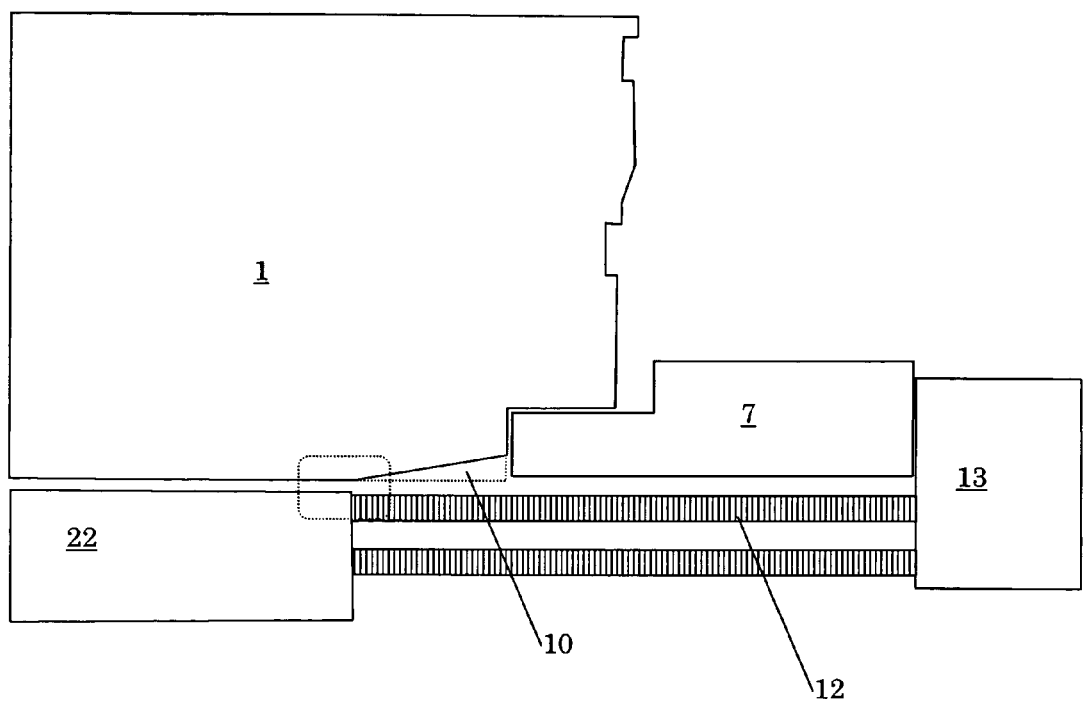
FIG. 9 shows an embodiment of a gas shower of the apparatus of FIG. 1.

FIG. 9 shows a side view of the lower region of the projection system 1, that includes a plurality of stacked optical elements (not shown). The view of FIG. 9 is depicted generally along a path of the interferometric beams 12 of FIG. 3. By providing cut outs 10, the gas flow reaches the volume more central to the projection system 1 more easily. The cut out section 10 includes a generally downward oriented slope 21 extending to a generally flat lower surface of the projection system. This surface is arranged to coincide with the reference surface of the Z-mirror 11 (not shown). In addition, by providing the cut-outs, the temperature from the projection system 1 is less strongly transmitted to the gas flow flowing underneath it, resulting in a better conditioned gas flow in the relevant volume including the interferometric beams 12. These beams are illustrated to reflect to a substrate support 22 for supporting the substrate 3 depicted in FIG. 2.

While specific embodiments of the invention have been described above, it will be appreciated that the invention may be practiced otherwise than as described. The description is not intended to limit the invention.

What is claimed is:

1. A lithographic apparatus comprising:
    an illuminator for conditioning a beam of radiation;
    a first support for supporting a patterning device, the patterning device serving to pattern the beam of radiation according to a desired pattern;
    a second support for supporting a substrate;
    a projection system for projecting the patterned beam onto a target portion of the substrate, the projection system comprising a lower surface for defining a working distance to said substrate; and
    at least one gas generator for generating a conditioned gas flow, said gas generator comprising a deflecting panel adjacent to a Z-mirror that defines the lower surface of the projection system for deflecting said gas flow to a lower volume generally located below the lower surface of said projection system,
    wherein said deflecting panel is shaped to provide a first downward flow direction, and a second flow direction that is generally parallel to a lower surface of the projection system and to guide the gas flow along a surface of the deflecting panel.

2. A lithographic apparatus according to claim 1 wherein said deflecting panel comprises a suction opening comprised with a suction device to pull the gas flow towards a generally horizontal flow.

3. A lithographic apparatus according to claim 2, wherein said deflecting panel comprises a recess for guiding an interferometric beam in said recess.

4. A lithographic apparatus according to claim 1, wherein said deflecting panel comprises a first radial shape oriented generally radially when viewed from a center of the projection system, and a second tangential shape oriented generally partly around said projection system, and wherein said gas generator is arranged to provide a gas flow directed generally perpendicular to said deflecting panel.

5. A lithographic apparatus according to claim 4, wherein said gas generator further comprises a first section for providing a gas flow generally perpendicular to said radial shape of said panel, and a second section for providing a gas flow generally perpendicular to said tangential shape of said deflecting panel.

6. A lithographic apparatus according to claim 1, wherein the gas flow is guided along the surface of the deflecting panel according to the Coanda effect.

7. A lithographic apparatus according to claim 1, wherein said guiding element is physically attached to a metro frame carrying said projection system, and wherein said gas generator is attached to a base frame that is mechanically decoupled from said metro frame.

8. A lithographic apparatus comprising:

an illuminator for conditioning a beam of radiation;

a first support for supporting a patterning device, the patterning device serving to pattern the beam of radiation according to a desired pattern;

a second support for supporting a substrate;

a projection system for projecting the patterned beam onto a target portion of the substrate, the projection system comprising a lower surface for defining a working distance to said substrate; and at least one gas generator for generating a conditioned gas flow, said gas generator comprising a first guiding element for guiding said gas flow to a lower volume generally located below the lower surface of said projection system and to a volume between said lower surface and said substrate, wherein said first guiding element directs the gas flow in a generally downward direction and then in a direction generally parallel to said lower surface of the projection system; and a second guiding element that is arranged in the gas flow to locally deflect and split the gas flow so that the gas flow is partially directed to said volume between said lower surface and said substrate, and partially directed to said lower volume.

9. A lithographic apparatus according to claim 8, wherein the gas flow that is directed to said volume between said lower surface and said substrate has a higher velocity than the gas flow that is directed to said lower volume.

10. A lithographic apparatus according to claim 8, wherein said second guiding element comprises a plurality of vanes arranged in the gas flow.

11. A lithographic apparatus according to claim 8, wherein said first guiding element is physically attached to a metro frame carrying said projection system, and wherein said gas generator is attached to a base frame that is mechanically decoupled from said metro frame.

* * * * *